(12) United States Patent
Sethumadhavan et al.

(10) Patent No.: US 11,502,684 B1
(45) Date of Patent: Nov. 15, 2022

(54) DRIVER SAFE OPERATING AREA PROTECTION WITH CURRENT AND TEMPERATURE COMPENSATED TRIGGER CIRCUIT

(71) Applicant: TEXAS INSTRUMENTS INCORPORATED, Dallas, TX (US)

(72) Inventors: Sachin Sethumadhavan, Bangalore (IN); Ganapathi Shankar Krishnamurthy, Bangalore (IN)

(73) Assignee: Texas Instruments Incorporated

( * ) Notice: Subject to any disclaimer, the term of this patent is extended or adjusted under 35 U.S.C. 154(b) by 0 days.

(21) Appl. No.: 17/463,333

(22) Filed: Aug. 31, 2021

(51) Int. Cl.
*H03K 17/687* (2006.01)
(52) U.S. Cl.
CPC . *H03K 17/6872* (2013.01); *H03K 2217/0063* (2013.01); *H03K 2217/0072* (2013.01)
(58) Field of Classification Search
CPC ... H03K 2217/0072; H03K 2217/0063; H03K 17/6872
See application file for complete search history.

(56) References Cited

FOREIGN PATENT DOCUMENTS

| CN | 1470968 A | * | 1/2004 | .............. H02M 1/38 |
| JP | 5955428 B1 | * | 7/2016 | |

* cited by examiner

*Primary Examiner* — Metasebia T Retebo
(74) *Attorney, Agent, or Firm* — Michael T. Gabrik; Charles A. Brill; Frank D. Cimino

(57) ABSTRACT

A driver circuit includes a high side transistor, a low side transistor, a first trigger circuit, and a second trigger circuit. The high side transistor has a first control terminal and a first current path coupled between a first voltage terminal and an output voltage terminal. The low side transistor has a second control terminal and a second current path coupled between the output voltage terminal and ground. The first trigger circuit is coupled to the first control terminal, the first voltage terminal, and the output voltage terminal. The first trigger circuit is operable to protect the high side transistor. The second trigger circuit is coupled to the second control terminal, the first trigger circuit, and ground. The second trigger circuit is operable to protect the low side transistor.

20 Claims, 5 Drawing Sheets

DRIVER SAFE OPERATING AREA PROTECTION WITH CURRENT AND TEMPERATURE COMPENSATED TRIGGER CIRCUIT

BACKGROUND

A metal-oxide-semiconductor field-effect transistor (MOSFET) can be used in a driver circuit to control an electrical current or voltage supplied to a load. For instance, the MOSFET can be used as a switch to control an electrical current or voltage to power an electric motor. The MOSFET includes a source, a drain, a gate, and a depletion region. The MOSFET has a threshold voltage, such that when a voltage applied to the gate of the MOSFET crosses the threshold voltage, the MOSFET starts to conduct. When a voltage applied to the gate is less than the threshold voltage, the depletion region prevents the MOSFET from conducting. When a voltage applied to the gate is equal to or greater than the threshold voltage, a channel is formed in the depletion region, and the MOSFET conducts. The MOSFET has limited conditions in which it can safely operate. For instance, high voltages at the gate, the source, or a combination of the gate and the source can damage or destroy the MOSFET. The conditions in which the MOSFET can safely operate are called the safe operating area (SOA).

SUMMARY

In accordance with at least one example of the disclosure, a trigger circuit includes a first electrical branch, a second electrical branch, a third electrical branch, a fourth electrical branch, and a fifth electrical branch. The first electrical branch includes a first transistor and a first resistor. The first transistor has a first current terminal, a second current terminal, and a first control terminal adapted to be coupled to a first voltage. The second electrical branch is situated between the first control terminal and an output terminal and includes a second transistor and a second resistor. The second transistor has a third current terminal, a fourth current terminal, and a second control terminal coupled between the second current terminal and the first resistor. The third electrical branch is situated between the first control terminal and an output terminal and includes a third transistor and a third resistor. The third transistor has a fifth current terminal, a sixth current terminal, and a third control terminal coupled between the third current terminal and the second resistor. The fourth electrical branch is situated between the first control terminal and an output terminal and includes a fourth transistor and a fourth resistor. The fourth resistor has a seventh current terminal, an eighth current terminal, and a fourth control terminal coupled between the sixth current terminal and the third resistor. The fifth electrical branch is situated between the first control terminal and an output terminal and includes a fifth transistor and a fifth resistor. The fifth transistor has a ninth current terminal, a tenth current terminal, and a fifth control terminal coupled between the fourth resistor and the seventh current terminal.

In accordance with another example of the disclosure, a trigger circuit includes a first current path, a second current path, and a third current path. The first current path includes a first electrical branch and is adapted to draw a first electrical current from a first transistor. The second current path includes a second electrical branch and a third electrical branch and is adapted to be coupled to the first current path and draw a second electrical current form the first transistor. The second electrical is greater than the first electrical current. The third current path includes a fourth electrical branch and a fifth electrical branch and is adapted to draw a third electrical current from the first transistor. The third electrical current is greater than the second electrical current.

In accordance with yet another example of the disclosure, a driver circuit includes a high side transistor, a low side transistor, a first trigger circuit, and a second trigger circuit. The high side transistor has a first control terminal and a first current path coupled between a first voltage terminal and an output voltage terminal. The low side transistor has a second control terminal and a second current path coupled between the output voltage terminal and ground. The first trigger circuit is coupled to the first control terminal, the first voltage terminal, and the output voltage terminal. The first trigger circuit is operable to protect the high side transistor. The second trigger circuit is coupled to the second control terminal, the first trigger circuit, and ground. The second trigger circuit is operable to protect the low side transistor.

BRIEF DESCRIPTION OF THE DRAWINGS

For a detailed description of various examples, reference will now be made to the accompanying drawings in which.

The same reference numbers or other reference designators are used in the drawings to designate the same or similar (functionally and/or structurally) features.

DETAILED DESCRIPTION

A driver circuit may include one or more MOSFETs to control a current or voltage supplied to a load. For instance, each phase of a three-phase electric motor may have a high side MOSFET and a low side MOSFET. The high side MOSFET (HS-MOSFET) may be connected (e.g., the drain of the MOSFET) to a driving voltage, and the low side MOSFET (LS-MOSFET) may be connected (e.g., the source of the MOSFET) to a ground. When a driving current or voltage is to be supplied to a phase of the three-phase electric motor, a voltage is applied to the gate of the HS-MOSFET to connect the phase of the three-phase electric motor to the driving voltage. When the driving current or voltage is to stop being supplied to the phase of the three-phase electric motor, a voltage is applied to a gate of the LS-MOSFET to connect the phase of the three-phase electric motor to ground.

In the driver circuit, each MOSFET has an SOA defining the voltages at the gate, the source, and the drain of the MOSFET at which the MOSFET can safely operate without being damaged or destroyed. For instance, the MOSFET may be damaged or destroyed if a high voltage is applied at the gate, the source, or the drain or if the gate, the source, and/or the drain are short-circuited.

Disclosed herein are examples of driver circuits and trigger circuits to improve the SOA of a MOSFET. In examples, a driver circuit or a trigger circuit includes multiple NMOS transistors, multiple PMOS transistors, and multiple resistors. The multiple NMOS transistors, the multiple PMOS transistors, and the multiple resistors form multiple current paths that are used to enable the MOSFET to withstand greater voltages without being damaged. In some examples, the driver circuit or the trigger circuit draws current away from the gate, which reduces the voltage applied to the gate. When the voltage applied to the gate is reduced, the MOSFET is able to withstand greater voltages without being damaged or destroyed. For instance, a driver circuit or a trigger circuit may include a first pair of NMOS (n-channel MOSFET) and PMOS (p-channel MOSFET) transistors that draw current when the MOSFET is operating at lower gate current or slew rates, and the driver circuit or the trigger circuit may include a second pair of NMOS and PMOS transistors that draw current when the MOSFET is operating at higher gate currents. This enables the driver circuit or the trigger circuit to compensate for different operating conditions and improve the SOA of the MOSFET.

Additionally, in some example embodiments, a driver circuit or a trigger circuit including the multiple current paths may have current and temperature responses (e.g., less variation with current and temperature changes) as opposed to conventional solutions.

Figure 1:
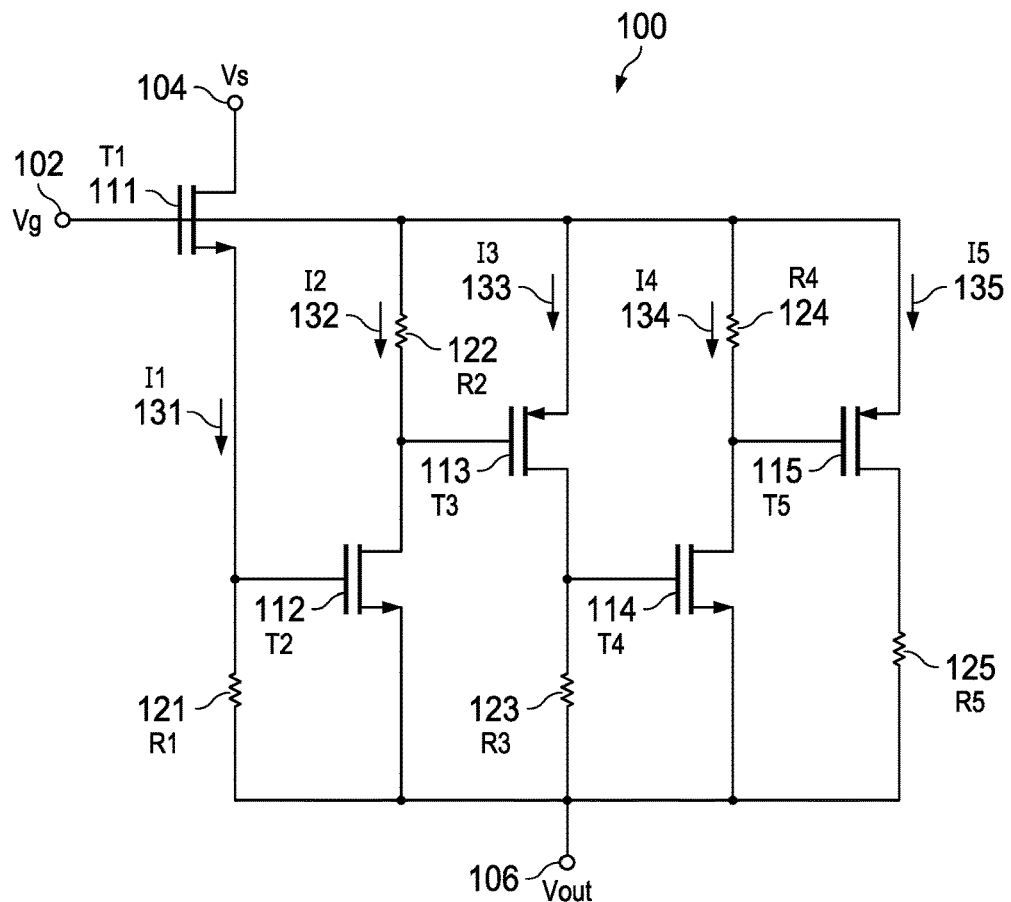
FIG. 1 is a circuit diagram of a trigger circuit in accordance with various examples.

FIG. 1 is a circuit diagram of a trigger circuit 100 in accordance with various examples. The trigger circuit 100 is configured to be connected to a driver circuit that includes a MOSFET. Specifically, the trigger circuit 100 is configured to receive a gate voltage (Vg) 102 (gate voltage 102 may, for example, be the same gate voltage that is applied to the gate of the HS-MOSFET) of the MOSFET, a source voltage (Vs) 104 of the MOSFET (source voltage 104 may, for example, be the same voltage that is applied to the drain of the HS-MOSFET), and an output voltage (Vout) 106 of the driver circuit. The trigger circuit 100 includes a first transistor (T1) 111, a second transistor (T2) 112, a third transistor (T3) 113, a fourth transistor (T4) 114, and a fifth transistor (T5) 115. Preferably, the T1 111, the T2 112, and the T4 114 are NMOS transistors, and the T3 113 and the T5 115 are PMOS transistors. However, the T1 111, the T2 112, the T3 113, the T4 114, and the T5 115 are not limited to any particular types of transistors, and the T1 111, the T2 112, the T3 113, the T4 114, and the T5 115 are optionally any types or combination of types of transistors. The trigger circuit 100 also includes a first resistor (R1) 121, a second resistor (R2) 122, a third resistor (R3) 123, a fourth resistor (R4) 124, and a fifth resistor (R5) 125. The trigger circuit 100 includes five different parallel current paths. The first current path includes the T1 111 and the R1 121. The second current path includes the T2 112 and the R2 122. The third current path includes the T3 113 and the R3 123. The fourth current path includes the T4 114 and the R4 124, and the fifth current path includes the T5 115 and the R5 125.

When a voltage that is below the threshold voltage of the T1 111 is applied to T1 111 by the Vg 102, the T1 111 remains off or is turned-off and current is not able to pass through T1 111 from the drain of the T1 111 to the source of the T1 111. When a voltage that is at or above the threshold voltage of the T1 111 is applied to the T1 111 by the Vg 102, the T111 is turned-on and a current is able to pass through T1 111 from the drain of the T1 111 to the source of the T1 111.

When the T1 111 is turned-on and the Vs 104 includes a positive voltage that is applied to the drain of the T1 111, a first current (I1) 131 is passed through the T1 111 and, assuming that the current flowing into the gate of T2 112 is negligible, the R1 121. The I1 131 passing through the R1 121 generates a positive voltage at the gate of the T2 112. When the I1 131 is low and the positive voltage at the gate of the T2 112 is below the threshold voltage of the T2 112, the T2 112 remains off or is turned-off and a second current (I2) 132 is not able to pass through the T2 112 from the drain of T2 112 to the source of the T2 112. When the I1 131 is high and the positive voltage at the gate of the T2 112 is at or above the threshold voltage of the T2 112, the T2 112 is turned-on and the I2 132 is able to pass through the T2 112 from the drain of the T2 112 to the source of the T2 112.

Current I2 132 flows through resistor R2 122. Since little (if any current) flows through the gate of transistor T3 113, current I2 132 is approximately equal to the current flowing through transistor T2 112. When transistor T2 112 is turned on (e.g., conducting), there is a voltage drop across resistor R2 122 that is equal to (R2*I2). This voltage drop causes the voltage at the gate of transistor T3 113 to be lower than the voltage at the source of transistor T3 113. When the I2 132 is low and the gate-to-source voltage (Vgs) of T3 113 is not sufficient to turn on transistor T3 113, the third current (I3) 133 does not pass through resistor R3 123. When the I2 132 is high and Vgs of transistor T3 113 is sufficient to turn on T3 113 (e.g., T3 113 is conducting), a voltage drop occurs across resistor R3 123. The voltage drop is approximately equal to (I3*R3) (assuming that the current flowing into the gate of T4 114 is negligible).

The voltage drop across R3 123 creates a voltage at the gate of the T4 114. When the I3 133 is low and the Vgs of the T4 114 is below the threshold voltage of the T4 114, the T4 114 remains off or is turned-off and a fourth current (I4) 134 is not able to pass through the T4 114. When the I3 133 is high and Vgs of the T4 114 is at or above the threshold voltage of the T4 114, the T4 114 is turned-on and conducts through the T4 114. Assuming that the current flowing into the gate of T5 115 is negligible, the current I4 134 is approximately equal to the current from drain to the source of T4 114 and the voltage drop across resistor R4 124 is approximately equal to (R4*I4).

Vgs of transistor T5 115 is approximately equal to the voltage drop across resistor R4 124. When the I4 134 is low, the magnitude of Vgs of the T5 115 will be below the threshold voltage of the T5 115 and T5 115 will remain off (e.g., not conducting) or will be turned-off and a fifth current (I5) 135 will not able to pass through the T5 115. When the I4 134 is high and the magnitude of Vgs of the T5 115 is at or above the threshold voltage of the T5 115, the T5 115 is turned-on (e.g., conducting) and the I5 135 is able to pass through the T5 115 thereby causing a voltage drop across resistor R5 125 equal to approximately (I5*R5).

In light of the above, the trigger circuit 100 may include four different operating regions. In a first operating region, all of the currents in the trigger circuit 100 are approximately zero (e.g., the I1 131, the I2 132, the I3 133, the I4 134, and the I5 135 are all approximately zero). In a second operating region, the I1 131 is greater than zero, but the I1 131 is not large enough to cause the T2 112 and the T3 113 to be turned-on (e.g., the I1 131 is greater than zero, and the I2 132, the I3 133, the I4 134, and the I5 135 are approximately zero). In the second operating region, the trigger circuit 100 uses the first current path (including the T1 111 and the R1 121). In a third operating region, the I1 131 is greater than zero and is large enough to cause the T2 112 and the T3 113 to be turned-on, but the I3 133 is not large enough to cause the T4 114 and the T5 115 to be turned-on (e.g., the I1 131, the I2 132, and the I3 133 are greater than zero, and the I4 134 and the I5 135 are approximately zero). In the third operating region, the trigger circuit 100 uses the first current path (including the T1 111 and the R1 121), the second current path (including the T2 112 and the R2 122), and the third current path (including the T3 113 and the R3 123). In a fourth operating region, the I1 131 is large enough to cause T2 112 and the T3 113 to be turned-on, and the I3 133 is large enough to cause the T4 114 and the T5 115 to be turned-on. In the fourth operating region, the trigger circuit 100 uses the first current path (including the T1 111 and the R1 121), the second current path (including the T2 112 and the R2 122), the third current path (including the T3 113 and the R3 123), the fourth current path (including the T4 114 and the R4 124), and the fifth current path (including the T5 115 and the R5 125). Accordingly, all of the currents in the trigger circuit 100 are greater than zero (e.g., the I1 131, the I2 132, the I3 133, the I4 134, and the I5 135 are all greater than zero).

In the example embodiment of FIG. 1, transistors T1 111, T2 112, and T4 114 are implemented using NMOS transistors and transistors T3 113 and T5 115 are implemented using PMOS transistors. In some embodiments, at low currents, the transistor pair formed by T2 112 and T3 113 sinks current and the transistor pair formed by T4 114 and T5 115 are turned off (e.g., not conducting). As the current through T3 113 increases, T4 114 and T5 115 are turned on (e.g., conducting) at progressively higher currents through T3 113. This allows for a fairly constant clamp voltage with respect to current. This is useful as transient currents during short circuit of transistor T1 111 can increase due to currents from the gate-to-drain capacitance of T1 111. After the transient(s) decrease, the clamp current is limited. An additional benefit of some example embodiments is the ability to compensate the temperature coefficient of clamp voltage. The overdrive of T2 112 can be independently adjusted to vary temperature coefficient to be either positive or negative. This decreases the variation of clamping voltages.

The different operating regions of the trigger circuit 100 may enable the trigger circuit 100 to be able to compensate for different operating conditions of a MOSFET. For instance, if no voltages are applied to a MOSFET, the trigger circuit 100 does not draw any currents. As increasingly larger voltages are applied to the MOSFET, additional resistors are used in the trigger circuit 100 to draw current clamping the gate to source voltage, which protects the MOSFET from potential damage from voltages applied to the pads of the MOSFET or from the MOSFET being short-circuited.

Figure 2:
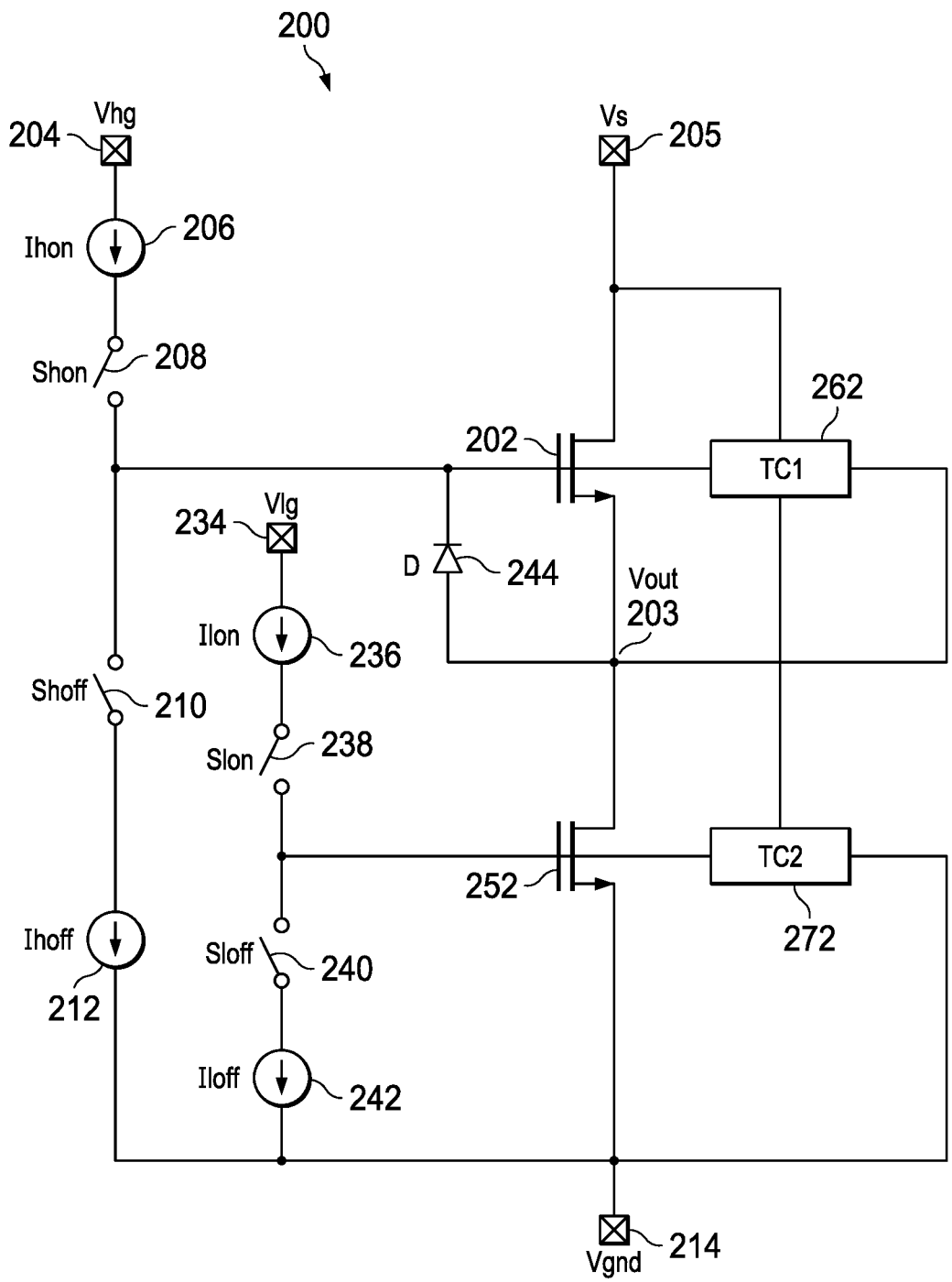
FIG. 2 is a schematic diagram of a driver circuit in accordance with various examples.

FIG. 2 is a schematic diagram of a driver circuit 200 in accordance with various examples. The driver circuit 200 includes a HS-MOSFET 202, a first trigger circuit (TC1) 262, a LS-MOSFET 252, and a second trigger circuit (TC2) 272 that are used to control an output voltage (Vout) 203. Each of the TC1 262 and the TC2 272 may be implemented similarly to the trigger circuit 100 in FIG. 1 (where, for example, transistors 202 and/or 252 would be connected to T1 111 of FIG. 1, respectively). A drain of the HS-MOSFET 202 is connected to a voltage source electrical pad (Vs) 205, and a source of the HS-MOSFET 202 is connected to the Vout 203. A drain of the LS-MOSFET 252 is connected to the Vout 203, and a source of the LS-MOSFET 252 is connected to an electrical ground (Vgnd) 214. Accordingly, the HS-MOSFET 202 and the LS-MOSFET 252 can be used to connect the Vout 203 to either the Vs 205 or the Vgnd 214.

The HS-MOSFET 202 is controlled (e.g., turned on and/or turned off) by a high side gate electrical connection pad (Vhg) 204, a high side on current source (Ihon) 206, a high side switch on (Shon) 208, a high side switch off (Shoff) 210, a high side off current source (Ihoff) 212, and the Vgnd 214. When the Ihon 206 is turned-on, a current from the Ihon 206 closes the Shon 208. When the Shon 208 is closed, the Vhg 204 is applied to a gate of the HS-MOSFET 202. The Vhg 204 may be a voltage that is at or above the threshold voltage of the HS-MOSFET 202 such that the HS-MOSFET 202 is turned-on and can conduct when the Shon 208 is closed. When the Ihoff 212 is turned-on, a current from the Ihoff 212 closes the Shoff 210. When the Shoff 210 is closed, the gate of the HS-MOSFET 202 is connected to the Vgnd 214. The Vgnd 214 may be an electrical ground (e.g., 0 volts) that is less than the threshold voltage of the HS-MOSFET 202 such that the HS-MOSFET 202 is turned-off and does not conduct electricity when Shoff 210 is closed. Shon 208 and Shoff 210 should not be closed (e.g., conducting) at the same time.

The LS-MOSFET 252 is controlled (e.g., turned on and/or turned off) by a low side gate electrical connection pad (Vlg) 234, a low side on current source (Ilon) 236, a low side switch on (Slon) 238, a low side switch off (Sloff) 240, a low side off current source (Iloff) 242, and the Vgnd 214. When the Ilon 236 is turned-on, a current from the Ilon 236 closes the Slon 238. When the Slon 238 is closed (e.g., conducting), the Vlg 234 is applied to a gate of the LS-MOSFET 252. The Vlg 234 may be a voltage that is at or above the threshold voltage of the LS-MOSFET 252 such that the LS-MOSFET 252 is turned-on and can conduct when the Slon 238 is closed. When the Iloff 242 is turned-on, a current from the Iloff 242 closes the Sloff 240 (thereby causing it to be conducting). When the Sloff 240 is closed, the Vgnd 214 is applied to the gate of the LS-MOSFET 252 (thereby causing it to be turned off, e.g., making it non-conducting). The Vgnd 214 may be the electrical ground (e.g., 0 volts) that is less than the threshold voltage of the LS-MOSFET 252 such that the LS-MOSFET 252 is turned-off and does not conduct electricity when Sloff 240 is closed. Slon 238 and Sloff 240 should not be closed (e.g., conducting) at the same time.

The TC1 262 is connected to the gate of the HS-MOSFET 202, the Vs 205, the Vout 203, and the TC2 272. For instance, in some examples where the TC1 262 is implemented similarly to the trigger circuit 100 in FIG. 1, a voltage at the gate of the HS-MOSFET 202 would be similar to Vg 102 (e.g., Vg 102 in FIG. 1) that is connected to the TC 262 (where, for example, HS-MOSFET 202 would be connected to transistor 111 of FIG. 1). In this example, Vs 104 (e.g., Vs 104 in FIG. 1) is similar to Vs 205, and Vout 106 (e.g., Vout 106 in FIG. 1) is similar to the Vout 203. Vout 203 may be connected to the gate of the HS-MOSFET 202 through a diode 244. In some examples where the TC1 262 is implemented similarly to the trigger circuit 100 in FIG. 1, the TC1 262 may include a terminal (e.g., such as Vout 106 shown in FIG. 1) that is connected to the TC2 272.

When the HS-MOSFET 202 is turned on and a voltage is applied across the drain and the source of the HS-MOSFET 202 (e.g., the Vs 205 is at the drain and the Vout 203 is at the source), a current flows through the HS-MOSFET 202. The TC1 262 triggers in this condition and is able to pass gate current (e.g., Ihon 206) through multiple pairs of NMOS and PMOS transistors as voltages are increased across one or both of the drain and source of the HS-MOSFET 202 or the gate of the HS-MOSFET 202. This reduces or clamps the voltage from the gate to the source of the HS-MOSFET 202, and thus can protect the HS-MOSFET 202 from damage when high voltages are applied to the Vhg 204, the Vs 205, and/or the Vout 203 or when the HS-MOSFET 202 is short-circuited.

The TC2 272 is connected to the gate of the LS-MOSFET 252, the TC1 262, and the Vgnd 214. For instance, in some examples where the TC2 272 is implemented similarly to the trigger circuit 100 in FIG. 1, the gate of the LS-MOSFET 252 is connected to Vg 102; the Vgnd 214 terminal is connect to Vout 106; and the terminal of TC1 262 that is the same as Vout 106 is connected to the terminal of TC2 272 that is the same as Vs 104."

When the LS-MOSFET 252 is turned on and a voltage is applied across the drain and the source of the LS-MOSFET 252 (e.g., the Vout 203 is at the drain and the Vgnd 214 is at the source), a current flows through the LS-MOSFET 252. The TC2 272 triggers in this condition and is able to pass gate current (e.g., Ihon 236) through multiple pairs of NMOS and PMOS transistors as voltages are increased across one or both of the drain and the source of the LS-MOSFET 252 or the gate of the LS-MOSFET 252. This reduces or clamps the voltage from the gate to the source of the LS-MOSFET 252, and thus can protect the LS-MOSFET 252 from damage when high voltages are applied to the Vlg 234, the Vout 203, and/or the Vgnd 214 or when the LS-MOSFET 252 is short-circuited.

Figure 3:
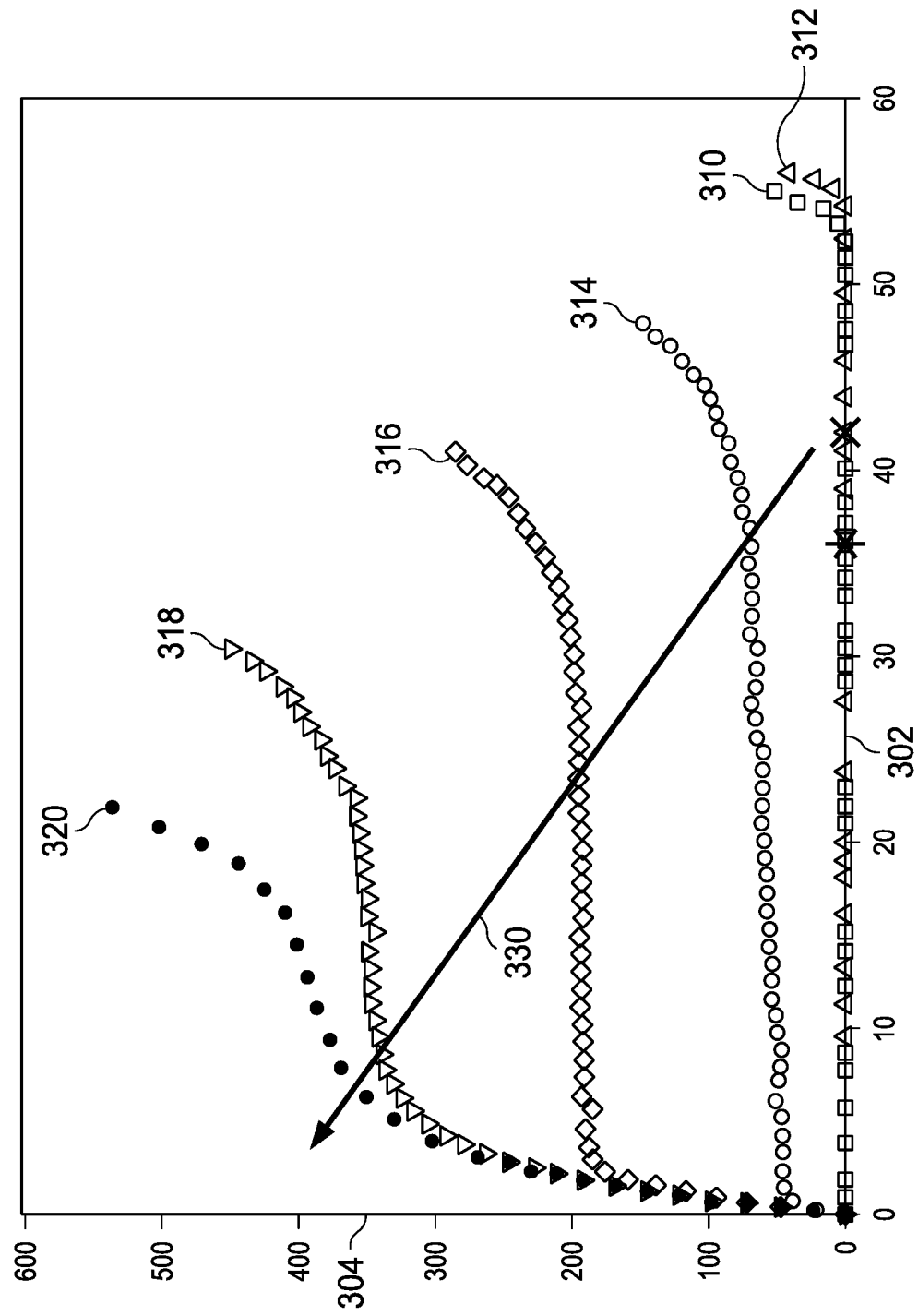
FIG. 3 is a graph of currents flowing through a MOSFET connected to a trigger circuit in accordance with various examples.

FIG. 3 is graph 300 of currents flowing through a MOSFET connected to a trigger circuit, in accordance with various examples. The x-axis or horizontal axis 302 represents the voltage (Vds) across the drain and the source of the MOSFET, and the y-axis or the vertical axis 304 represents the current (Id) flowing through the drain and the source of the MOSFET in milliamps. The current curves 310, 312, 314, 316, 318, and 320 show currents across the drain and the source of the MOSFET when voltages of 0 volts, 1 volts, 2 volts, 3 volts, 4 volts, and 5 volts are applied between the gate and the source (Vgs) of the MOSFET. The current curves 310, 312, 314, 316, 318, and 320 show that current increases as the voltage applied to the gate of the MOSFET increases. The current also increases as the voltage across the drain and the source of the MOSFET increases. In particular, the beginning of the current curves 310, 312, 314, 316, 318, and 320 show that there is a linear region in which the current across the drain and the source of the MOSFET increases linearly with increasing voltage across the drain and the source of the MOSFET. After the linear region, the current curves 310, 312, 314, 316, 318, and 320 show that there is a saturation region in which the current across the drain and the source of the MOSFET remains relatively flat or unchanged as the voltage across the drain and the source of the MOSFET increases. After the saturation region, the current curves 310, 312, 314, 316, 318, and 320 show that there is a breakdown region in which the current across the drain and the source of the MOSFET begins to rapidly increase. Operating the MOSFET in the breakdown region is not safe and could cause damage to or destruction of the MOSFET. The SOA for the MOSFET is represented by the area to the left of the SOA line 330. These are combinations of conditions (e.g., gate voltages and voltages across the drain and the source) that the MOSFET can safely be operated in without damaging the MOSFET. In at least certain examples of the present disclosure, the SOA for the MOSFET may prevent large voltages across the drain, the source, and the gate of the MOSFET, which helps maintain the MOSFET in the SOA.

Figure 4:
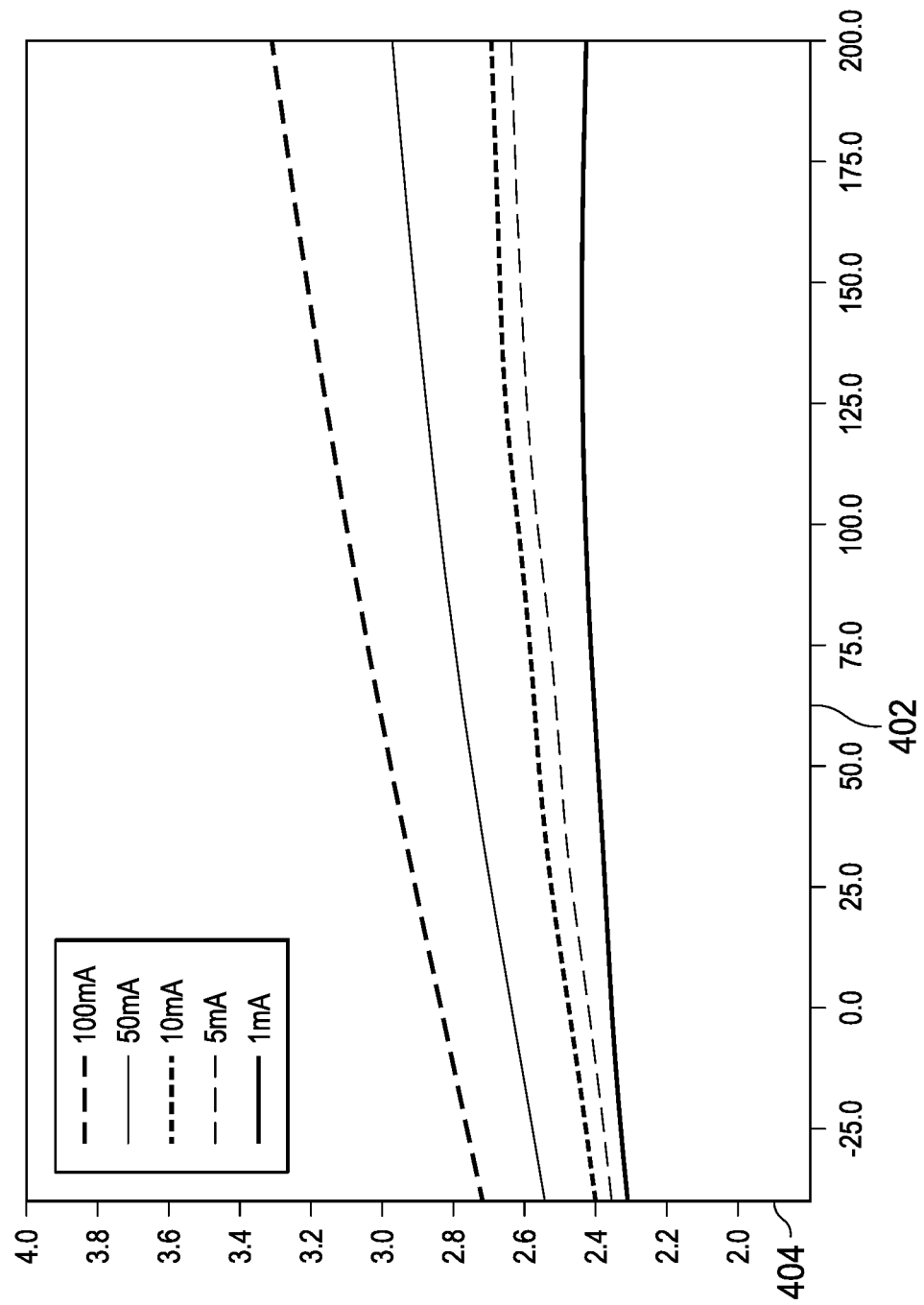
FIG. 4 is a graph of clamping voltages of a MOSFET in a driver circuit as a function of operating temperature of the MOSFET in accordance with various examples.

FIG. 4 is a graph 400 of clamping voltages of a MOSFET (e.g., a voltage from a gate to a source of a MOSFET similar to MOSFETS 202 and/or 252 in FIG. 2) in a driver circuit (e.g., driver circuit 200 in FIG. 2) as a function of operating temperature of the MOSFET. The x-axis or horizontal axis 402 represents the operating temperature in degrees Celsius (° C.) in which the MOSFET is operating in, and the y-axis or the vertical axis 404 represents the clamping voltage in volts. The graph 400 shows several different voltage curves representing the clamping voltages for different values of currents flowing through the MOSFET. For instance, the graph 400 includes curves for 1 milliamp (mA), 5 mA, 10 mA, 50 mA, and 100 mA. The graph 400 shows that for lower values of gate current flowing through the MOSFET that the temperature coefficient of the driver circuit is relatively flat (e.g., the clamping voltage remains approximately constant over the temperature range). Additionally, the graph 400 shows that for higher values of gate current flowing through the MOSFET that the temperature coefficient of the trigger circuit is slightly positive (e.g., the clamping voltage slightly increases over the temperature range). For instance, the top voltage curve in graph 400 (e.g., the curve for 100 mA) having the highest temperature coefficient shows that the clamping voltage only increases from a value of about 2.7 volts at a temperature of −30° C. to a value of about 3.2 volts at a temperature of 200° C., which results in a positive temperature coefficient of +0.00217 volts/° C. Accordingly, in at least certain examples of the present disclosure, the driver circuits may have temperature coefficient performance in that clamping voltages with reduced variation as the operating temperatures of the driver circuits change.

Figure 5:
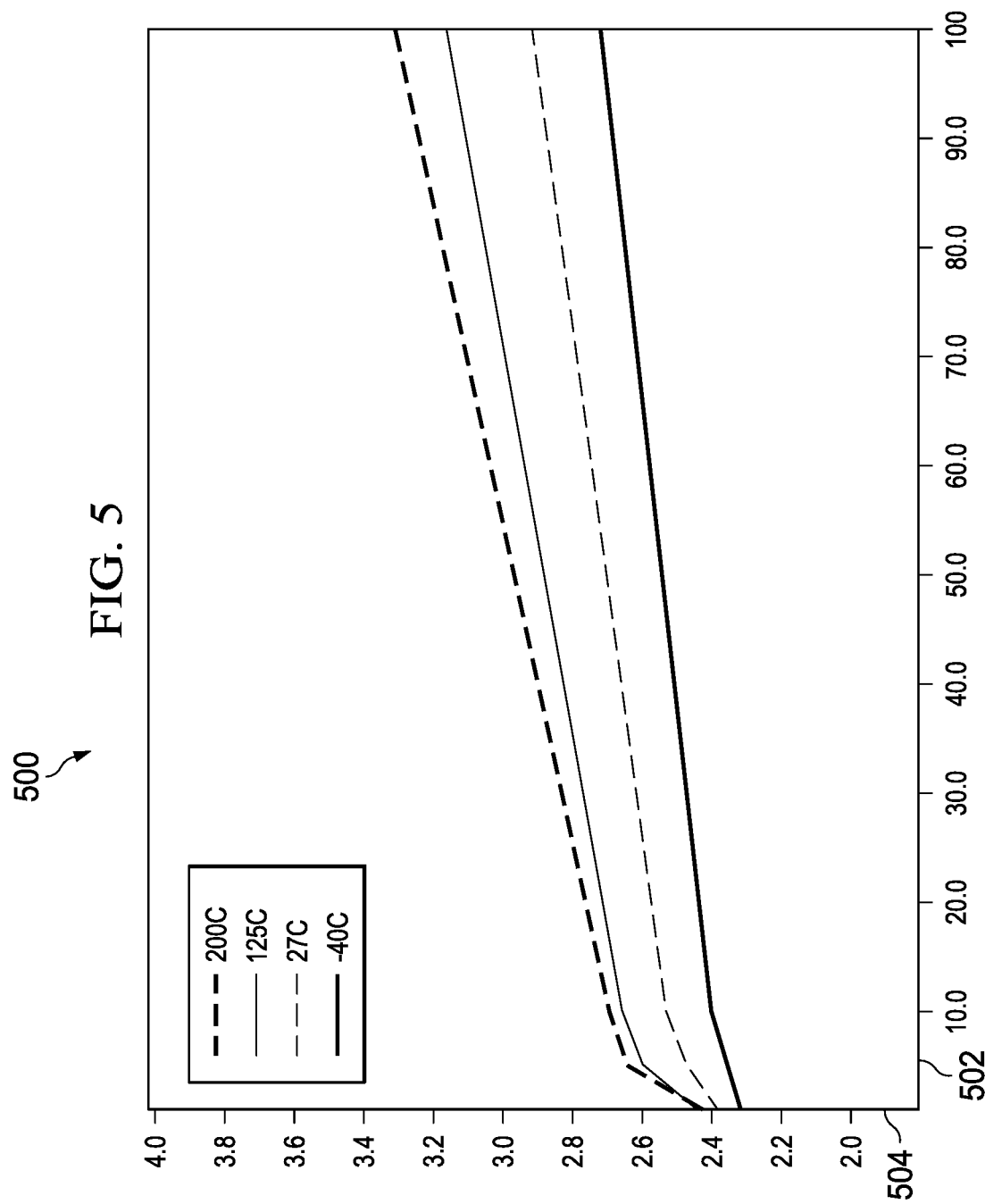
FIG. 5 is a graph of clamping voltages of a MOSFET in a driver circuit as a function of current flowing through the MOSFET in accordance with various examples.

FIG. 5 is a graph 500 of clamping voltages of a MOSFET (e.g., a voltage from a gate to a source of a MOSFET similar to MOSFETS 202 and/or 252 in FIG. 2) in a driver circuit (e.g., driver circuit 200 in FIG. 2) as a function of current flowing through the gate of the MOSFET in accordance with various examples. The x-axis or horizontal axis 502 represents the current flowing through the gate of MOSFET in milliamps, and the y-axis or the vertical axis 504 represents the clamping voltage in volts. The graph 500 shows several different clamping voltage curves representing the clamping voltage for different operating temperatures of the MOSFET. For instance, the graph 500 includes curves for −40° C., 27° C., 125° C., and 200° C. The graph 500 demonstrates that the clamping voltage in the driver circuit remains relatively flat or only increases slightly (e.g., the clamping voltage remains approximately constant) over a gate current range. For instance, the graph 500 shows that for lowest operating temperature of −40° C. of the MOSFET (e.g., the lowest curve in FIG. 5) that the clamping voltage is relatively flat over a current range (e.g., the clamping voltage only increases from about 2.3 volts to about 2.6 volts for the 1 mA to 100 mA current range shown in FIG. 5). For the highest operating temperature of 200° C. of the MOSFET (e.g., the highest curve in FIG. 5), the clamping voltage only increases slightly over the current range (e.g., for the highest operating temperature represented by the top curve in FIG. 5, the clamping voltage only increases from about 2.4 volts to about 3.2 volts for the 2 mA to 100 mA current range shown in FIG. 5). Accordingly, in at least certain examples, the MOSFETs in the driver circuits may have clamping voltage performance with reduced variation as the gate current flowing through the MOSFET changes due to programmable slew rates of the driver.

Figure 6:
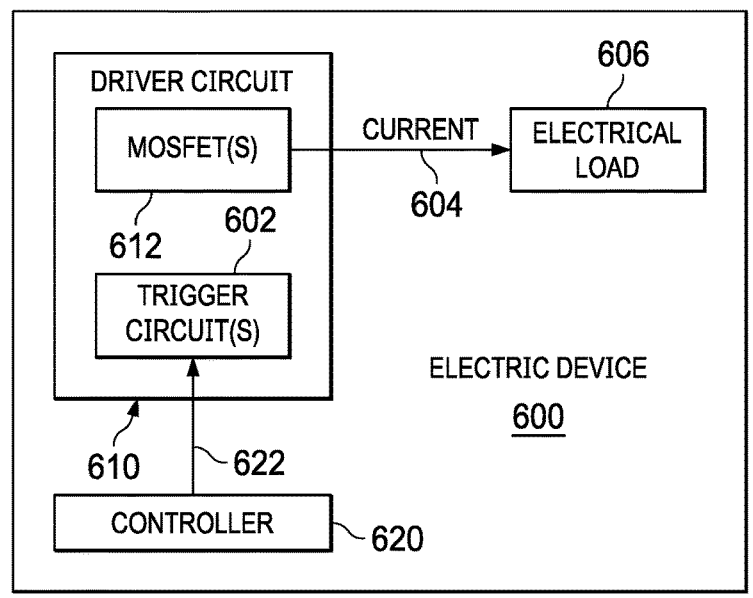
FIG. 6 is a schematic diagram of an electrical device with a trigger circuit in accordance with various examples.

FIG. 6 is a schematic diagram of an electric device 600 with a trigger circuit 602 in accordance with various examples. The electric device 600 may be any device that controls an electrical current 604 to an electrical load 606. For instance, the electric device 600 may be a device having an electric motor, a medical device, a textile device, a manufacturing device, a printer, or any other type of electric device. The electric device 600 includes a driver circuit 610, a controller 620, and an electrical load 606. The driver circuit 610 includes one or more MOSFETs 612 (e.g., MOSFETS 202 and/or 252 in FIG. 2) and one or more trigger circuits 602 (e.g., trigger circuit 100 in FIG. 1, trigger circuit 262 in FIG. 2, and/or trigger circuit 272 in FIG. 2). The controller 620 generates a control signal 622 that provides an instruction to the driver circuit 610. For instance, the control signal 622 may indicate a position or speed of an electric motor. The driver circuit 610 receives the control signal 622 and uses the control signal 622 to control the one or more MOSFETs 612 to provide an electrical current 604 (e.g., Vout 106 in FIG. 1 and/or Vout 203 in FIG. 2) to the electrical load 606. The one or more MOSFETs 612 may be connected to one or more trigger circuits 602 (e.g., the MOSFETs 612 may be connected to one or more trigger circuits 602 similar to MOSFET 202 being connected to trigger circuit 262 in FIG. 2 and/or MOSFET 252 being connected to trigger circuit 272 in FIG. 2).

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While certain components may be described herein as being of a particular process technology, these components may be exchanged for components of other process technologies. Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground voltage potential" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means+/−10 percent of the stated value. Modifications are possible in the described examples, and other examples are possible within the scope of the claims.

What is claimed is:

1. A trigger circuit, comprising:
a first electrical branch including a first transistor and a first resistor, the first transistor having a first current terminal, a second current terminal and a first control terminal adapted to be coupled to a first voltage;
a second electrical branch situated between the first control terminal and an output terminal and including a second transistor and a second resistor, the second transistor having a third current terminal, a fourth current terminal and a second control terminal coupled between the second current terminal and the first resistor;
a third electrical branch situated between the first control terminal and the output terminal and including a third transistor and a third resistor, the third transistor having a fifth current terminal, a sixth current terminal and a third control terminal coupled between the third current terminal and the second resistor;
a fourth electrical branch situated between the first control terminal and the output terminal and including a fourth transistor and a fourth resistor, the fourth transistor having a seventh current terminal, an eighth current terminal and a fourth control terminal coupled between the sixth current terminal and the third resistor; and
a fifth electrical branch situated between the first control terminal and the output terminal and including a fifth transistor and a fifth resistor, the fifth transistor having a ninth current terminal, a tenth current terminal and a fifth control terminal coupled between the fourth resistor and the seventh current terminal.

2. The trigger circuit of claim 1, wherein the first transistor, the second transistor, and the fourth transistor include n-channel metal-oxide semiconductor (NMOS) transistors, and wherein the third transistor and the fifth transistor include p-channel metal-oxide semiconductor (PMOS) transistors.

3. The trigger circuit of claim 1, wherein the second control terminal is electrically connected to the first electrical branch at a first point between the second current terminal and the first resistor, wherein the third control terminal is electrically connected to the second electrical branch at a second point between the second resistor and the third current terminal, wherein the fourth control terminal is electrically connected to the third electrical branch at a third point between the sixth current terminal and the third resistor, and wherein the fifth control terminal is electrically connected to the fourth electrical branch at a fourth point between the fourth transistor and the seventh current terminal.

4. The trigger circuit of claim 1, wherein the first current terminal is configured to be connected to a voltage source electrical pad, and wherein the first resistor is configured to be connected to a voltage output.

5. The trigger circuit of claim 4, wherein the first transistor is configured to receive the first voltage from a high side gate metal-oxide-semiconductor field-effect transistor (HS-MOSFET).

6. The trigger circuit of claim 1, wherein the first current terminal is configured to be connected to a voltage output, and wherein the first resistor is configured to be connected to a voltage ground.

7. The trigger circuit of claim 6, wherein the first transistor is configured to receive the first voltage from a low side gate metal-oxide-semiconductor field-effect transistor (LS-MOSFET).

8. A trigger circuit, comprising:
   a first current path including a first electrical branch and adapted to draw a first electrical current from a first transistor;
   a second current path including a second electrical branch and a third electrical branch and adapted to be coupled to the first current path and draw a second electrical current from the first transistor, the second electrical current being greater than the first electrical current; and
   a third current path including a fourth electrical branch and a fifth electrical branch and adapted to draw a third electrical current from the first transistor, the third electrical current being greater than the second electrical current.

9. The trigger circuit of claim 8, wherein the first electrical branch includes a second transistor and a first resistor, wherein the second electrical branch includes a third transistor and a second resistor, wherein the third electrical branch includes a fourth transistor and a third resistor, wherein the fourth electrical branch includes a fifth transistor and a fourth resistor, and wherein the fifth electrical branch includes a sixth transistor and a fifth resistor.

10. The trigger circuit of claim 8, wherein the first electrical branch comprises a first n-channel metal-oxide semiconductor (NMOS) transistor, wherein the second electrical branch comprises a second NMOS transistor, wherein the third electrical branch comprises a first p-channel metal-oxide semiconductor (PMOS) transistor, wherein the fourth electrical branch comprises a third NMOS transistor, and wherein the fifth electrical branch comprises a second PMOS transistor.

11. The trigger circuit of claim 8, wherein the first electrical branch includes a first resistor, wherein the second electrical branch includes a second resistor, wherein the third electrical branch includes a third resistor, wherein the fourth electrical branch includes a fourth resistor, and wherein the fifth electrical branch includes a fifth resistor.

12. The trigger circuit of claim 8, wherein the first electrical branch, the second electrical branch, the third electrical branch, the fourth electrical branch, and the fifth electrical branch are connected in parallel between a first gate voltage of the first transistor and an output voltage.

13. The trigger circuit of claim 8, wherein the first electrical branch, the second electrical branch, the third electrical branch, the fourth electrical branch, and the fifth electrical branch are connected in parallel between an output voltage and a ground.

14. A driver circuit, comprising:
   a high side transistor having a first control terminal and having a first current path coupled between a first voltage terminal and an output voltage terminal;
   a low side transistor having a second control terminal and having a second current path coupled between the output voltage terminal and ground;
   a first trigger circuit having first, second and third connection points, the first connection point coupled to the first control terminal, the second connection point coupled to the first voltage terminal and the third connection point coupled to the output voltage terminal, the first trigger circuit operable to protect the high side transistor; and
   a second trigger circuit having fourth, fifth and sixth connection points, the fourth connection point coupled to the second control terminal, the fifth connection point coupled to the first trigger circuit, and the sixth connection point coupled to ground, the second trigger circuit operable to protect the low side transistor.

15. The driver circuit of claim 14, wherein the high side transistor includes a first current terminal and a second current terminal and the first trigger circuit is operable to clamp a voltage between the first control terminal and the first current terminal.

16. The driver circuit of claim 14, wherein the low side transistor includes a first current terminal and a second current terminal and the second trigger circuit is operable to clamp a voltage between the second control terminal and the first current terminal.

17. The driver circuit of claim 14, wherein each of the first trigger circuit and the second trigger circuit includes a transistor and a resistor.

18. The driver circuit of claim 14, wherein each of the first trigger circuit and the second trigger circuit includes two parallel current paths.

19. The driver circuit of claim 14, wherein each of the first trigger circuit and the second trigger circuit includes three parallel current paths.

20. The driver circuit of claim 14, wherein each of the first trigger circuit and the second trigger circuit includes five parallel electrical branches.

* * * * *